(12) United States Patent  (10) Patent No.: US 6,563,757 B2
Agata                      (45) Date of Patent:   May 13, 2003

(54) SEMICONDUCTOR MEMORY DEVICE

(75) Inventor: Masashi Agata, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/043,324

(22) Filed: Jan. 14, 2002

(65) Prior Publication Data

US 2002/0093865 A1 Jul. 18, 2002

(30) Foreign Application Priority Data

Jan. 16, 2001 (JP) ........................................ 2001-007256

(51) Int. Cl.[7] ............................................... G11C 19/08
(52) U.S. Cl. .............. 365/222; 365/230.03; 365/230.06
(58) Field of Search ............................ 365/222, 230.03, 365/230.06

(56) References Cited

U.S. PATENT DOCUMENTS 5,724,296 A  * 3/1998 Jang ........................... 365/222
5,805,524 A    9/1998 Kotani et al.
6,023,440 A  * 2/2000 Kotani et al. ............... 365/222

FOREIGN PATENT DOCUMENTS

JP    10-134569    5/1998

* cited by examiner

Primary Examiner—Huan Hoang
(74) Attorney, Agent, or Firm—McDermott, Will & Emery

(57) ABSTRACT

One memory cell array is divided into three memory sub-arrays, each having a sense amplifier sub-array. A refresh word line selection circuit is provided for each memory sub-array. When a word line in the memory sub-array located in the center, for example, is to be selected in response to an external access request, a selector in the center selects a row decoder to allow selection of the word line designated by the external address. Simultaneously, a selector for each of the other memory sub-arrays selects the refresh word line selection circuit to allow selection of one word line to be refreshed in the memory sub-array. Thus, refresh operation can be performed simultaneously in the memory cell array in which a word line is being selected in response to the external access request.

12 Claims, 11 Drawing Sheets

CASE OF CLK=200MHz

CASE OF CLK=100MHz

US 6,563,757 B2

SEMICONDUCTOR MEMORY DEVICE

BACKGROUND OF THE INVENTION

The present invention relates to a semiconductor memory device for writing/reading data at high speed, as well as storing the data.

Conventionally, among semiconductor memory devices, dynamic random access memories (DRAMs), for example, have found many applications as devices capable of storing and holding a large capacity of data. FIG. 9 shows a basic configuration of a DRAM. Referring to FIG. 9, the DRAM includes a memory cell array 1. As partly shown in FIG. 10, the memory cell array 1 includes a number of memory cells 21 arranged in rows and columns. Each memory cell 21 is constructed of one capacitor C and one MOS transistor MT. The reference numeral 23 denotes bit lines into which data stored in the memory cells 21 are read, and 22 denotes word lines by which data in the memory cells 21 are read into the bit lines 23. A sense amplifier 24 amplifies data read into the bit lines 23. Data stored in the capacitor C of each memory cell 21 disappears with time due to leakage of a signal charge. Refresh operation is therefore required before disappearance of the data, in which the signal data is amplified by the sense amplifier 24 and the amplified data is written again in the capacitor C.

Referring back to FIG. 9, the DRAM also includes: a sense amplifier array 2 constructed of a plurality of sense amplifiers 24 described above; a row decoder 5 for selecting one word line in the memory cell array 1; a selector 3 connected to the sense amplifiers 24 in the sense amplifier array 2; a column decoder 6 for outputting a column selection signal to the selector 3 for selection of a predetermined number of data units amplified by the sense amplifiers 24; a Din buffer 7 for receiving input data Din and outputting the data to the selector 3; a Dout buffer 8 for externally outputting the data selected by the selector 3; and an address buffer 4 for receiving an external address Add on the occasion of a data read or write request and outputting the address to the row decoder 5 and the column decoder 6.

FIG. 11 is a view showing details of the row-related components of the DRAM in FIG. 9. In FIG. 11, the same components as those in FIG. 9 are denoted by the same reference numerals, and the description thereof is omitted. A control circuit 13 receives a read/write command on the occasion of an external data read or write request. The address buffer 4 receives an external address Add under control of the control circuit 13. A row predecoder 16 predecodes a row address received from the address buffer 4. A refresh counter 14 updates a refresh address for the memory cells 21. A selector 70 selects either the refresh counter 14 or the row predecoder 16. The control circuit 13 controls the selector 70 to select the row predecoder 16 when the read/write command is input, or select the refresh counter 14 when a refresh command is input.

Having the above configuration, the conventional semiconductor memory device is prevented from performing data read or write operation during refresh operation performed upon receipt of the refresh command. This disadvantageously deteriorates the access time of the DRAM. Overcoming this disadvantage is particularly important under the circumstances in these days where improvement in performance of semiconductor memory devices is sought.

Under the above circumstances, Japanese Laid-Open Patent Publication No. 10-134569, for example, discloses the following technique. A semiconductor memory device includes a plurality of banks each constructed of a set of one memory cell array and one row decoder. While data read or write operation is performed for the memory cell array in one bank, data read or write operation is also performed in parallel for a memory cell in the memory cell array in another bank.

The above conventional semiconductor memory device has the following problem. While refresh operation is possible in a bank in which data read or write operation is not underway, it is yet impossible to perform refresh operation in a bank in which data read or write operation is underway.

SUMMARY OF THE INVENTION

An object of the present invention is providing a semiconductor memory device capable of performing read or write operation at all times while requiring no external refresh request.

To attain the above object, according to the present invention, data read or write operation and refresh operation are performed simultaneously in one memory cell array in which one word line is internally selected in response to an external read or write access request. Specifically, the memory cell array is divided into a plurality of memory sub-arrays. During read or write operation for data in a memory cell in one memory sub-array, refresh operation is performed for the other memory sub-arrays simultaneously with the read or write operation.

The semiconductor memory device of the present invention is a semiconductor memory device having a memory cell array in which a word line is selected according to an external access, and includes: a plurality of memory sub-arrays obtained by dividing the memory cell array; normal word line selection means for selecting a word line in the memory cell array according to an external access; refresh word line selection means for selecting a word line at the same timing as the selection of the word line by the normal word line selection means in a memory sub-array other than a memory sub-array to which the word line selected by the normal word line selection means belongs; and sense amplifier sub-arrays provided for the respective memory sub-arrays for amplifying data corresponding to the word line selected by any of the two word line selection means.

In the semiconductor memory device described above, the refresh word line selection means may be shared by the plurality of memory sub-arrays. Alternatively, the refresh word line selection means may be provided for each of the memory sub-arrays.

In the semiconductor memory device described above, the refresh word line selection means is preferably constructed of a shift register for selecting one word line sequentially.

In the semiconductor memory device described above, the selection of a word line by the refresh word line selection means is preferably performed at a predetermined refresh period for each memory sub-array.

Preferably, the semiconductor memory device described above further includes refresh period setting means for setting the predetermined refresh period for the refresh word line selection means by dividing an external clock.

In the semiconductor memory device described above, the refresh period setting means preferably changes a dividing factor according to the period of the external clock.

In the semiconductor memory device described above, preferably, the memory cell array includes a plurality of memory cells, each of the memory cells includes one capacitor and two MOS transistors connected to the capacitor, and the two MOS transistors are connected to different bit lines, and data in the capacitor is read into the two bit lines alternately by operating the two MOS transistors alternately.

Thus, according to the present invention, in a memory cell array in which one word line is selected according to an external read or write access, one word line is selected in one memory sub-array during an external access, and simultaneously, one word line is also selected in each of the memory sub-arrays other than the memory sub-array to which the selected word line belongs by the refresh word line selection means. This makes it possible to perform automatic internal refresh operation simultaneously with data read or write operation performed according to an external read or write access, in one memory cell array. Thus, while refresh operation is performed automatically without the necessity of external request for refresh operation, external read or write access can be executed freely at all times without restriction by the refresh operation.

In particular, according to the present invention, one word line in each memory sub-array may be directly selected and activated by a shift register. This eliminates the necessity of supplying a refresh address to the memory sub-arrays, and thus improves the simplicity and efficiency of the semiconductor memory device.

DESCRIPTION OF THE PREFERRED EMBODIMENTS

Hereinafter, preferred embodiments of the present invention will be described with reference to the accompanying drawings.

(Embodiment 1)

Figure 1:
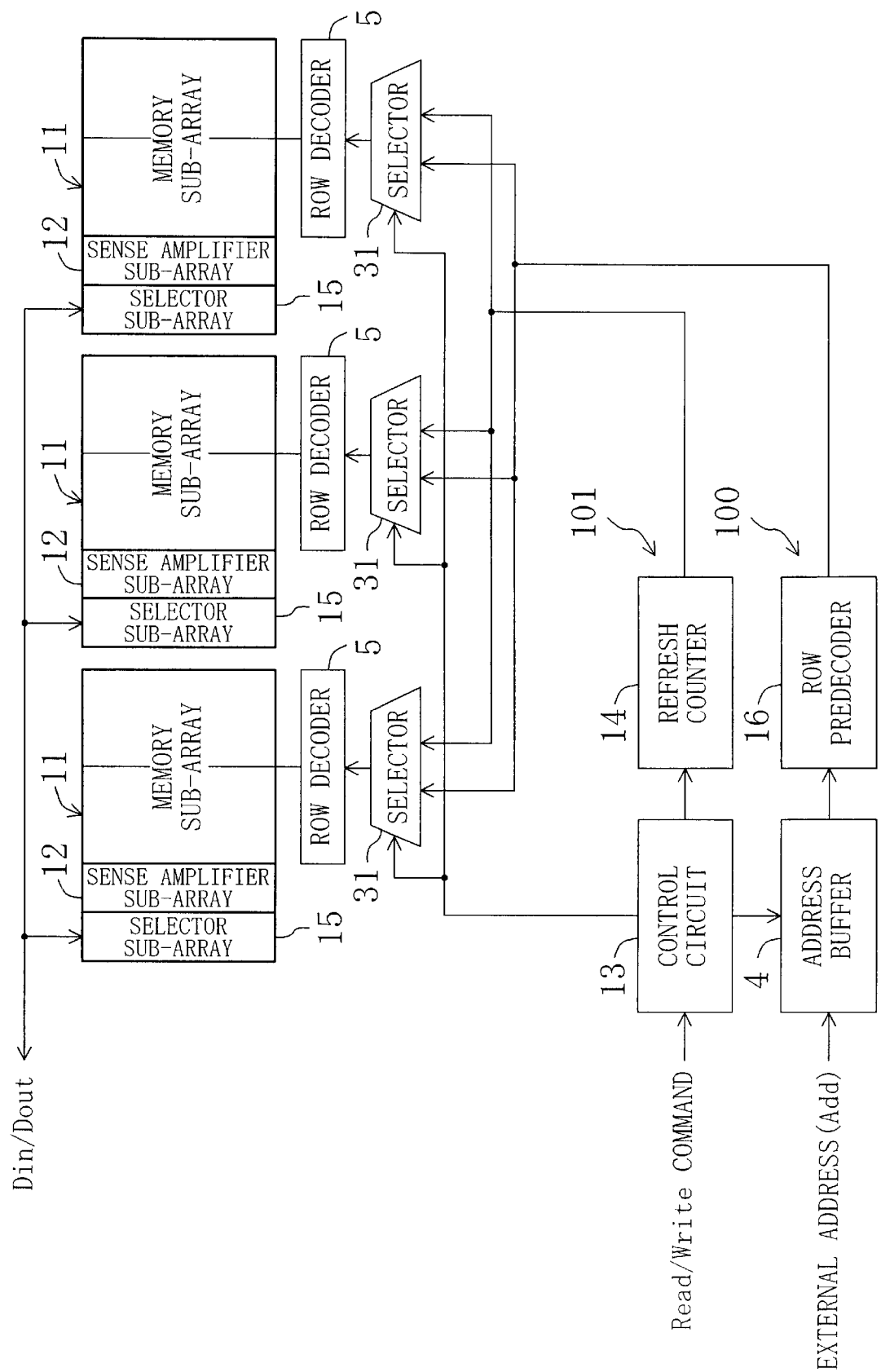
FIG. 1 is a block diagram of a semiconductor memory device of Embodiment 1 of the present invention.
Figure 9:
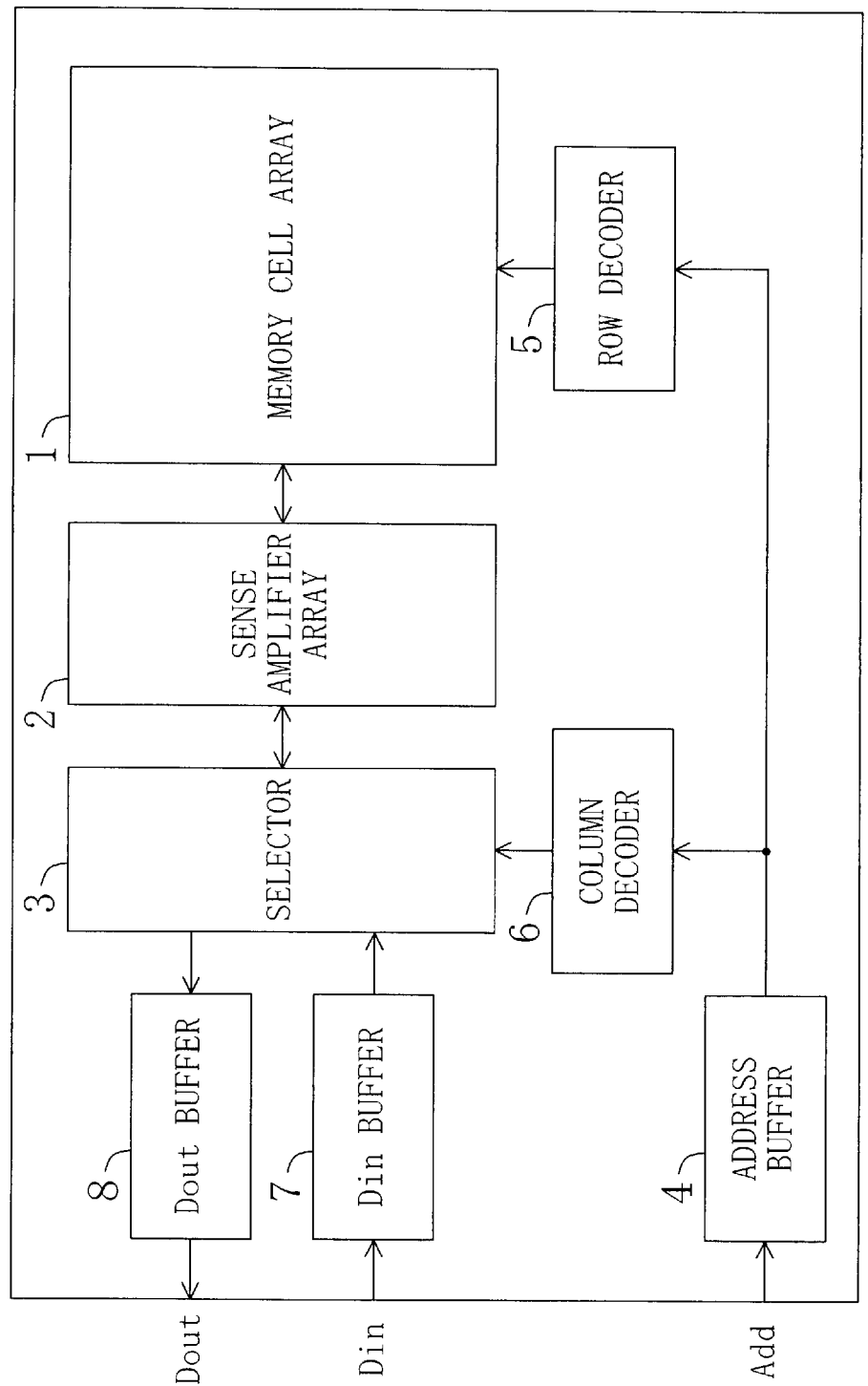
FIG. 9 is a schematic block diagram of a conventional semiconductor memory device.
Figure 10:
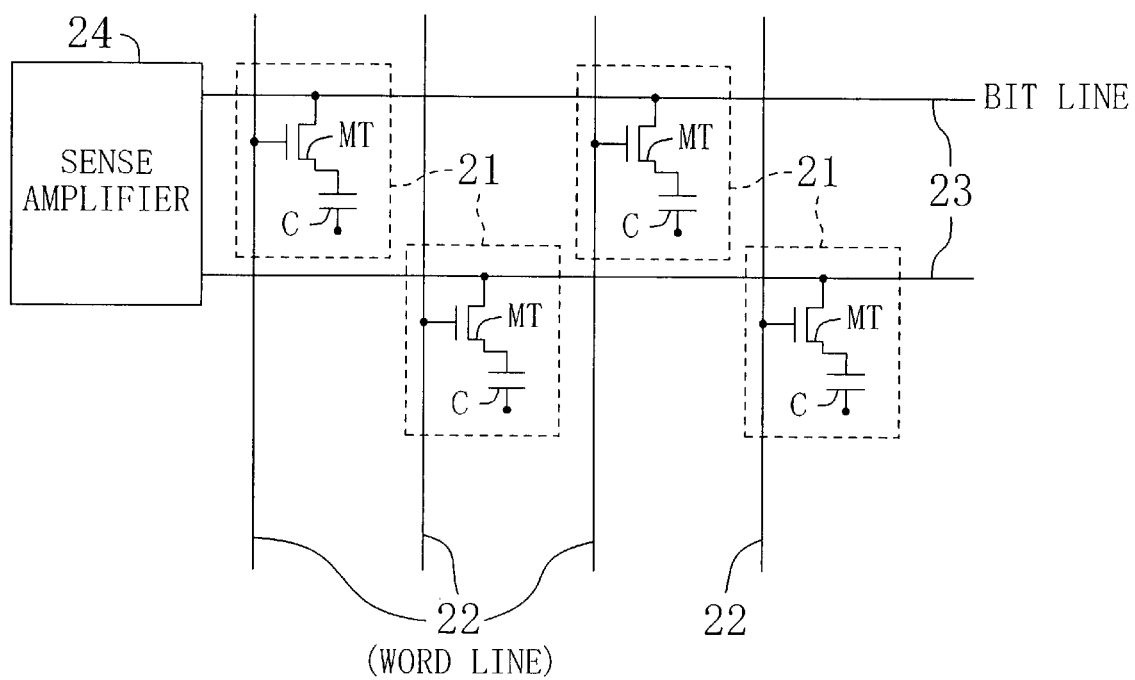
FIG. 10 is a view showing a partial configuration of a memory cell array of the conventional semiconductor memory device.
Figure 11:
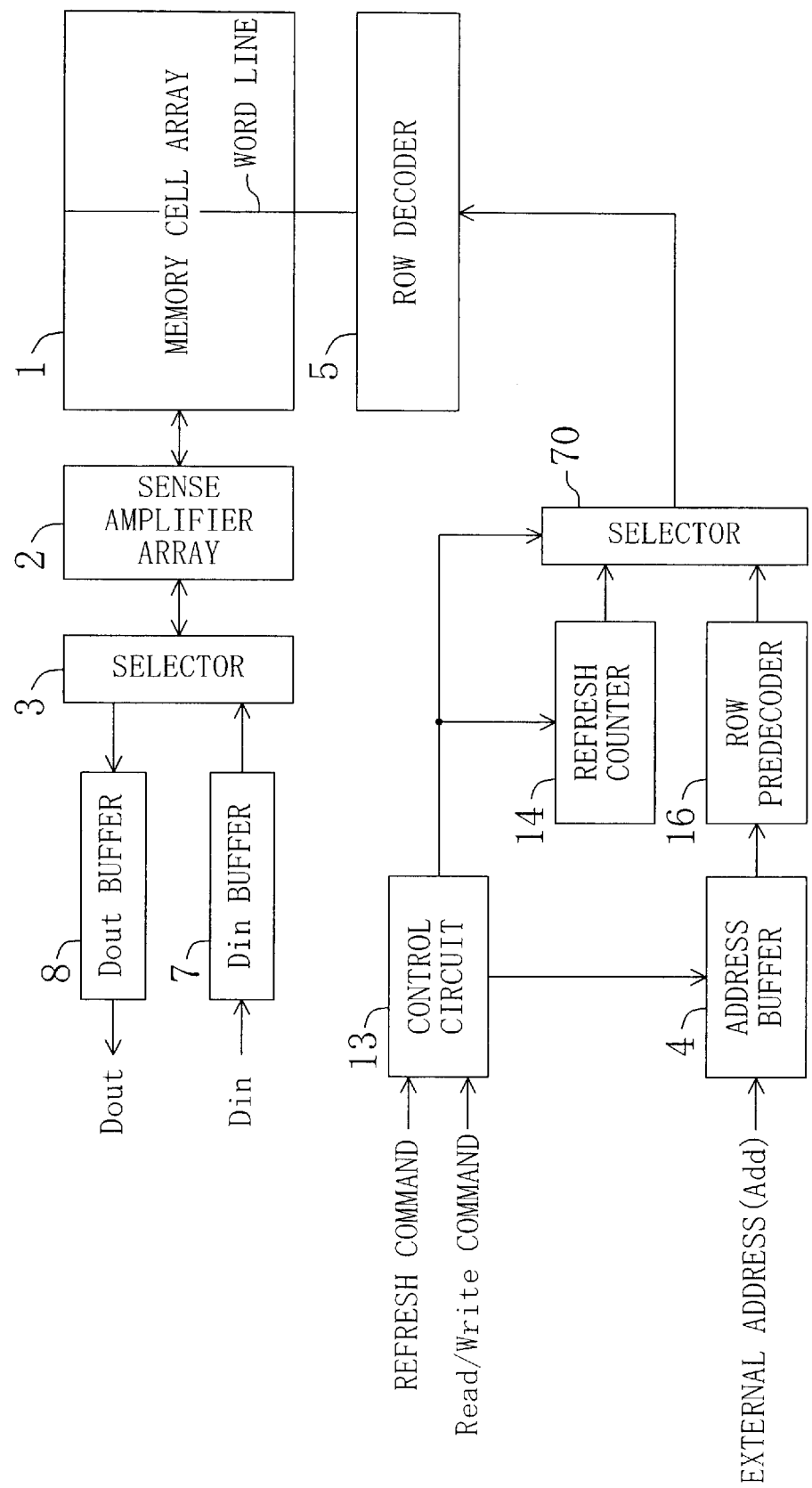
FIG. 11 is a detailed block diagram of the conventional semiconductor memory device.

FIG. 1 shows an internal configuration of a DRAM as a semiconductor memory device of Embodiment 1 of the present invention. Referring to FIG. 1, the semiconductor memory device includes a plurality of memory sub-arrays 11 (three in the illustrated example) obtained by dividing the memory cell array 1 shown in FIG. 9. In the memory cell array 1, one word line is selected during an external read or write access as will be described later.

Figure 2:
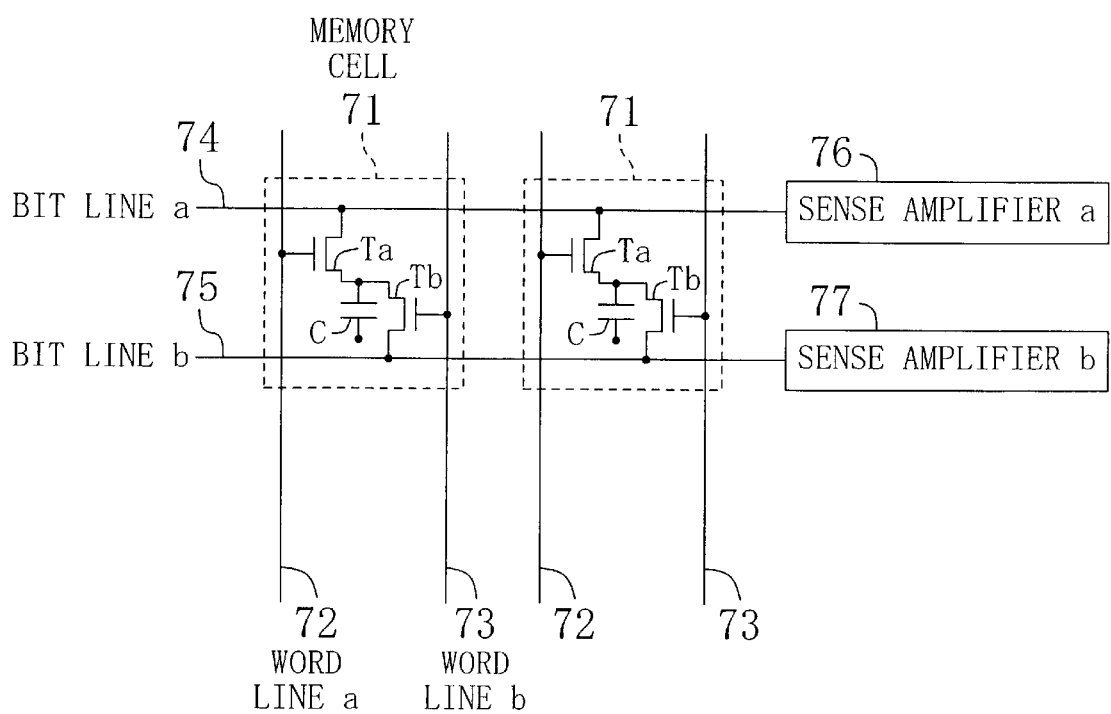
FIG. 2 is a view showing a partial configuration of a memory cell array of the semiconductor memory device of Embodiment 1.

As partly shown in FIG. 2, each memory sub-array 11 has a plurality of memory cells 71. Each memory cell 71 is constructed of one memory cell capacitor C and two MOS transistors Ta and Tb accessible to the memory cell capacitor C. One of the MOS transistors, Ta, is connected to a bit line a (74) and a word line a (72), and the bit line a (74) is connected to a sense amplifier a (76). The other MOS transistor Tb is connected to a bit line b (75) and a word line b (73), and the bit line b (75) is connected to a sense amplifier b (77). The word lines a (72) and b (73), the bit lines a (74) and b (75), and the sense amplifiers a (76) and b (77) are alternately accessed in each pair. By this alternate access, high-speed random operation is realized, where data in the memory cell 71 is read into the bit line in one set while the bit line in the other set is being precharged. By adopting this configuration, it is possible to attain a memory having an area one-third to one-fourth the area of a SRAM having memory cells each constructed of six MOS transistors.

Referring back to FIG. 1, a sense amplifier sub-array 12, which is provided for each memory sub-array 11, includes the sense amplifiers a (76) and b (77) described above. A selector sub-array 15, which is provided for each sense amplifier sub-array 12, selects either the sense amplifier a (76) or b (77) in the sense amplifier sub-array 12. Data (Dout) amplified by the sense amplifier selected by the selector sub-array 15 is externally output. The selector sub-array 15 is also constructed to receive input data (Din).

In FIG. 1, a row decoder 5, which is provided for each memory sub-array 11, selects one word line a (72) or b (73) in the corresponding memory sub-array 11. An address buffer 4 receives an external address Add on the occasion of a data read or write request, and outputs a row address and a column address of the external address. A control circuit 13 receives a read/write command on the occasion of an external data read or write request. The address buffer 4 receives the external address Add under control of the control circuit 13. A row predecoder 16 predecodes the row address received from the address buffer 4. A refresh counter 14 updates a refresh address for the memory sub-arrays 11 under control of the control circuit 13.

A selector 31, which is provided for each row decoder 5, selects either the row address from the row predecoder 16 or the refresh address from the refresh counter 14, under control of the control circuit 13.

The row predecoder 16 and the row decoder 5 constitute a normal word line selection means 100, and the refresh counter 14 and the row decoder 5 constitute a refresh word line selection means 101. The refresh counter 14 is shared by the three memory sub-arrays 11.

The operation of the semiconductor memory device described above will be described in detail. When read or write operation is requested externally, an external address is received by the address buffer 4, and the row predecoder 16 predecodes a row address of the external address. Assuming that the row address indicates a word line in the memory sub-array 11 located in the center as is viewed from FIG. 1, the control circuit 13 controls the selector 31 in the center to select the row address from the row predecoder 16. As a result, the row address from the row predecoder 16 selected by the selector 31 is decoded by the row decoder 5 in the center. The word line corresponding to the decoded row address is then selected in the memory sub-array 11 in the center, and data is output into the corresponding bit line.

At the same timing as the selection of the row address from the row predecoder 16 by the selector 31 described above, the control circuit 13 controls the other two selectors 31 to select the refresh address from the refresh counter 14. As a result, the refresh address selected by the two selectors 31 is decoded by the row decoders 5 on the right and left sides. A word line corresponding to the decoded address is then selected in each of the memory sub-arrays 11 on the right and left sides, that is, the memory sub-arrays 11 other than the memory sub-array 11 in the center to which the word line selected in response to the request for read or write operation belongs, and activated. Subsequently, data in the corresponding memory cells 71 are amplified and rewritten by the sense amplifiers in the sense amplifier sub-array 12, to effect refreshing.

Thus, when there is a request for read or write operation, it is possible to perform refresh operation of data in the memory cells 71 in parallel with the data read or write operation even in the same memory cell array including the word line selected in relation with the read or write request. This eliminates the necessity of requesting refresh operation externally, and enables read or write operation freely at all times without being influenced by the refresh operation.

When there is no external request for read or write operation, the refresh address generated periodically by the refresh counter 14 is supplied to all the memory sub-arrays 11 via all the selectors 31 and the row decoders 5 under control of the control circuit 13, to allow one word line to be selected and activated in each of the memory sub-arrays 11. Thus, the refresh operation is performed in all the memory sub-arrays 11.

As described above, conventionally, refresh operation is not allowed for a memory cell array including a selected word line during an external access. In this embodiment, however, refresh operation is possible in memory sub-arrays other than the memory sub-array to which the selected word line belongs. Thus, while a minimum of 2 to 3% of the entire time is consumed for external refresh access in the conventional DRAM, in addition to the read or write operation, no such time is required in this embodiment. This dramatically improves the access efficiency to the DRAM.

Moreover, according to the present invention, when there is no external access, refresh operation is performed for all the memory sub-arrays 11. To state differently, according to the present invention, refresh operation is performed for all the memory sub-arrays 11, in principle, irrespective of the presence/absence of an external access. And, as an exception, if there is an external access, the refresh operation in the accessed memory sub-array 11 is stopped, and read or write operation is performed randomly. In this way, access equivalent to that provided by a SRAM is attained.

In this embodiment, the configuration having one memory cell array 1 was described. As a matter of course, the present invention is also applicable to a configuration having a plurality of memory cell arrays, by dividing each memory cell array 1 into a plurality of memory sub-arrays 11.

(Embodiment 2)

Figure 3:
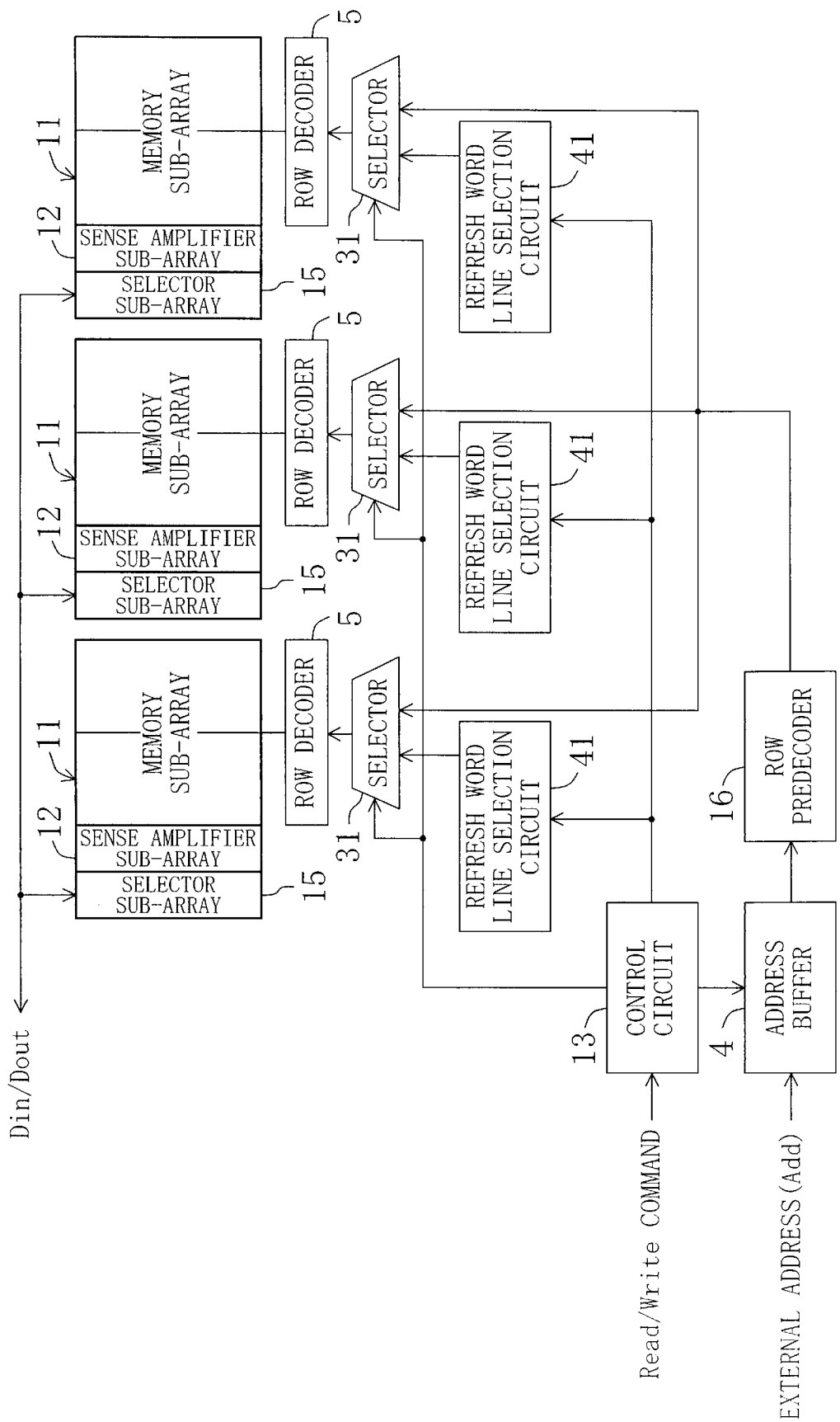
FIG. 3 is a block diagram of a semiconductor memory device of Embodiment 2 of the present invention.

FIG. 3 shows an internal configuration of a DRAM as a semiconductor memory device of Embodiment 2 of the present invention. In this embodiment, refresh word line selection circuits 41 are provided in place of the refresh counter 14 in FIG. 1. In FIG. 3, the three refresh word line selection circuits 41 are provided for the three memory sub-arrays 11. Each selector 31 selects either a refresh address from the corresponding refresh word line selection circuit 41 or the row address from the row predecoder 16, and outputs the results to the corresponding row decoder 5.

Thus, in this embodiment, in which the refresh word line selection circuits 41 are provided for the respective memory sub-arrays 11, refresh operation can be made using the refresh address different among the memory sub-arrays 11.

(Embodiment 3)

Figure 4:
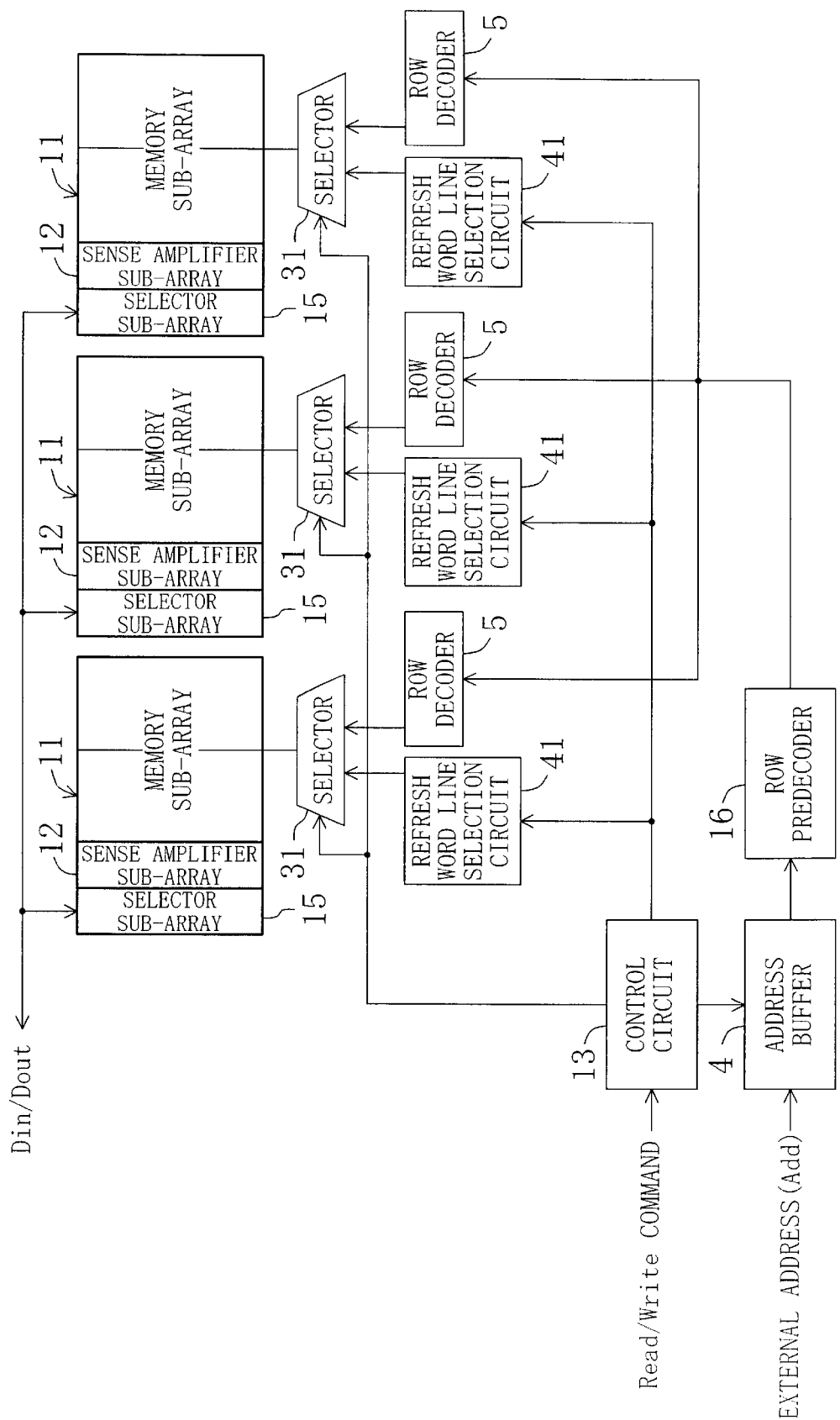
FIG. 4 is a block diagram of a semiconductor memory device of Embodiment 3 of the present invention.

FIG. 4 shows an internal construction of a DRAM as a semiconductor memory device of Embodiment 3 of the present invention. The DRAM of this embodiment is different from the DRAM in FIG. 3 in the position of the row decoders 5. That is, in FIG. 4, the row decoders 5 are placed at positions anterior to the selectors 31, in place of the positions posterior to the selectors 31 in FIG. 3. In this placement, the refresh word line selection circuits 41 output, not the refresh address information, but a signal for directly selecting and activating a word line to be refreshed.

Figure 5:
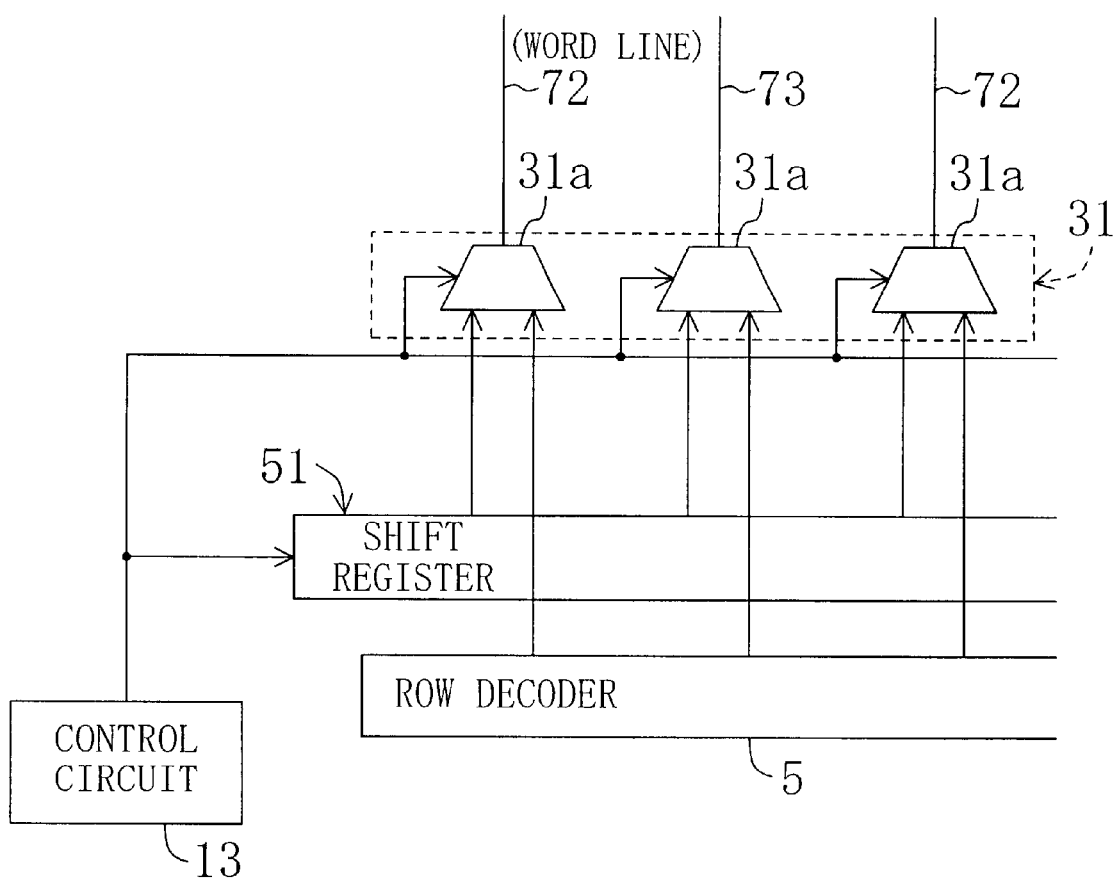
FIG. 5 is a view showing a specific configuration of a refresh word line selection circuit of the semiconductor memory device of Embodiment 3.

Each of the refresh word line selection circuits 41 is specifically constructed of a shift register 51 as shown in FIG. 5. The shift register 51 selects one word line at any time, and shifts the word line to be selected sequentially under control of the control circuit 13. Each selector 31 includes a plurality of selection circuits 31a connected to the plurality of word lines in the corresponding memory sub-array 11. Each selection circuit 31a selects either an activating signal output from the shift register 51 for selecting one word line or an activating signal output from the row decoder 5, to activate the corresponding word line.

In this embodiment, when an external access for a word line in the memory cell array is received, the selection circuit 31a corresponding to the word line in question selects the activating signal from the row decoder 5. At this time, the control circuit 13 stops the operation of the corresponding shift register 51 until the external access discontinues, putting the refresh operation in the standby state. Once the external access discontinues in the corresponding memory sub-array 11, the shift register 51 is selected again, and one word line sequentially selected by the shift register 51 is activated, to perform the refresh operation.

Thus, in this embodiment, it is not necessary to supply address information in the refresh counter to each memory sub-array 11. Therefore, an efficient semiconductor memory device is attained.

(Embodiment 4)

Figure 6:
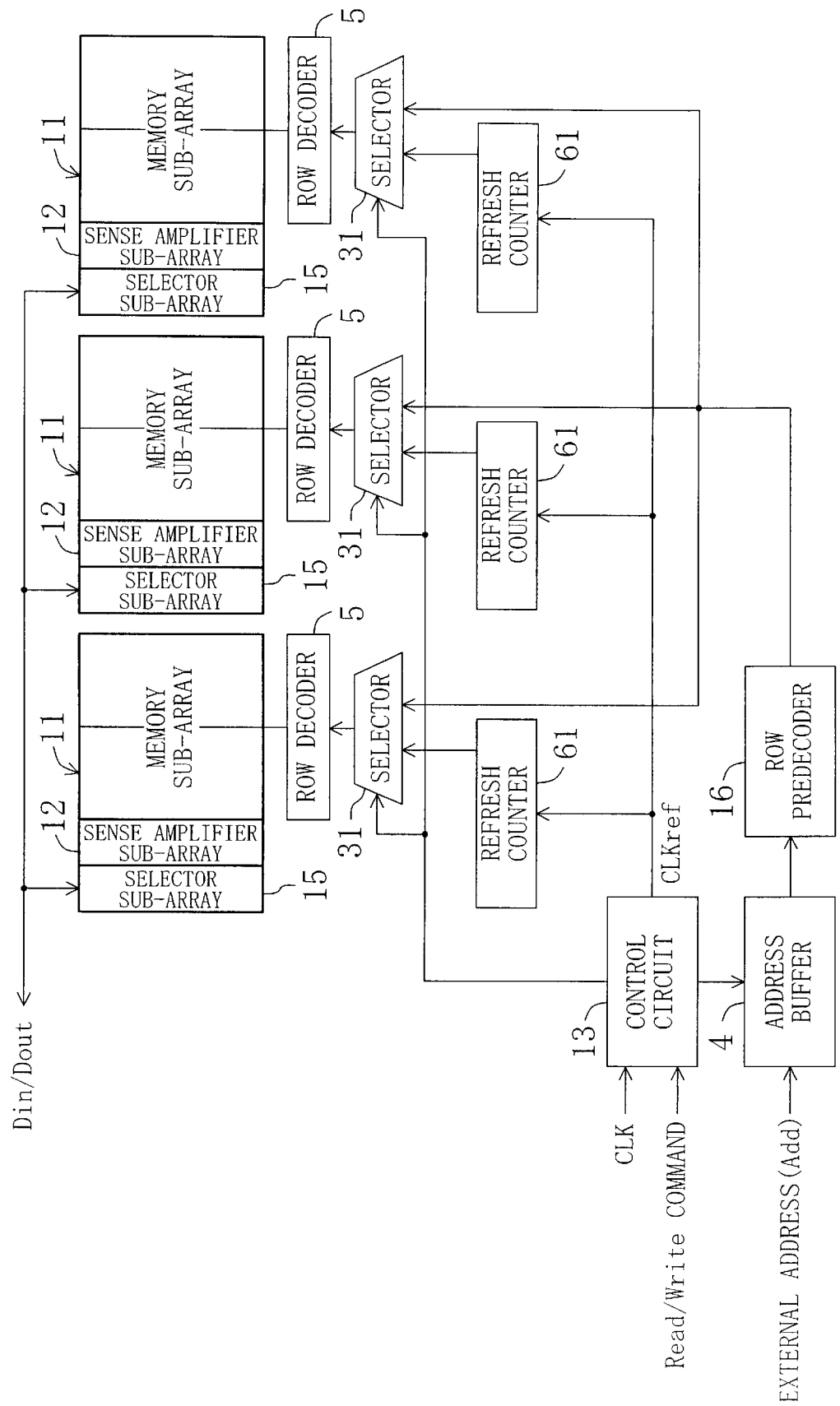
FIG. 6 is a block diagram of a semiconductor memory device of Embodiment 4 of the present invention.

FIG. 6 shows an internal construction of a DRAM as a semiconductor memory device of Embodiment 4 of the present invention. The DRAM of this embodiment includes refresh counters 61 in place of the refresh word line selection circuits 41 in Embodiment 2 shown in FIG. 2. The three refresh counters 61 are provided for the three memory sub-arrays 11 at positions anterior to the selectors 31.

Figure 7:
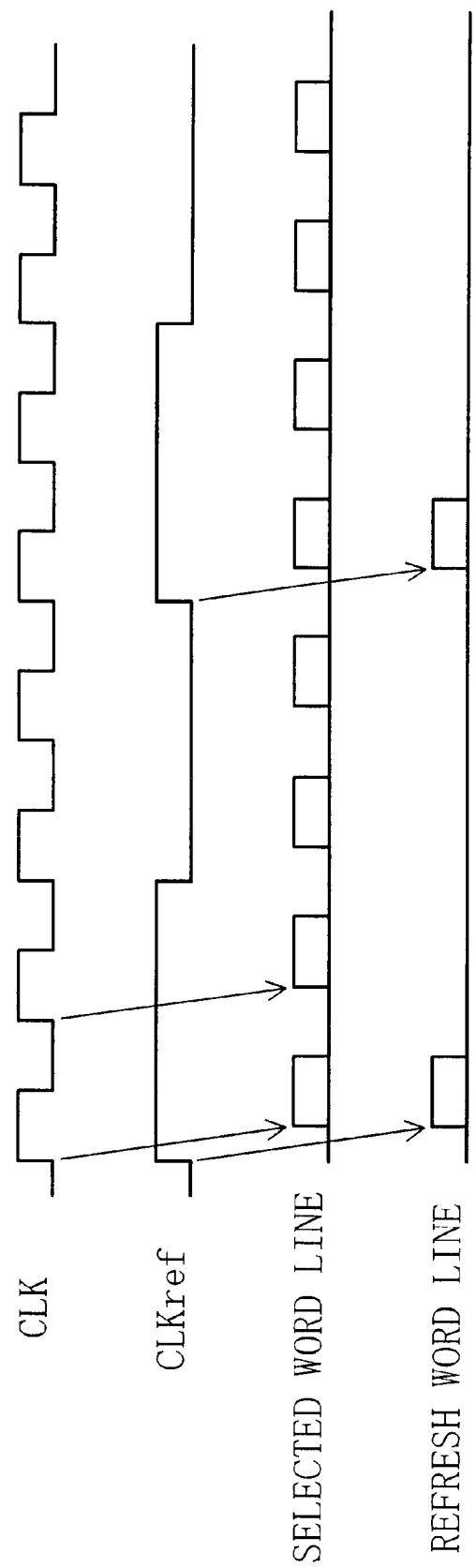
FIG. 7 is a view showing the relationship between the external clock and the refresh period.
Figure 8A:
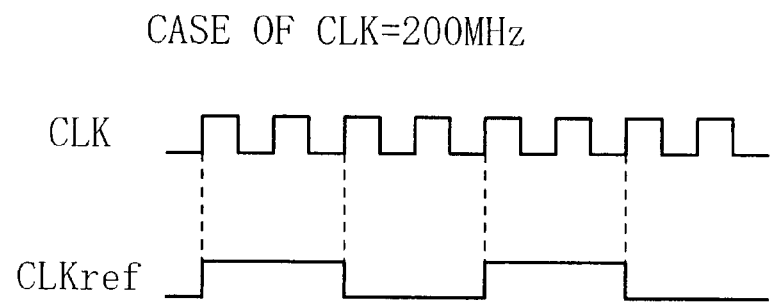
FIGS. 8A and 8B are illustrations of setting of the refresh period from an external clock of 200 MHz and an external clock of 100 MHz, respectively.
Figure 8B:
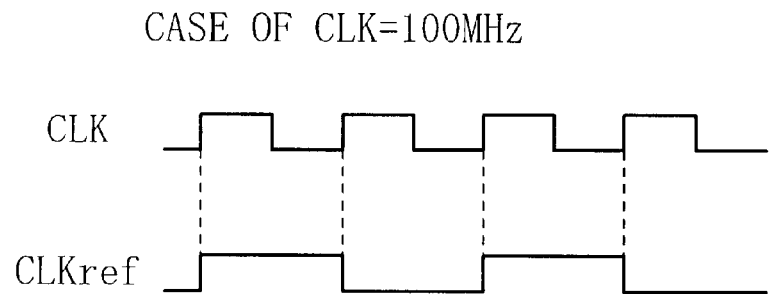

When external access is provided in synchronization with a clock, refresh operation is not necessarily performed at every clock cycle, but may be performed at a period determined depending on the signal holding property of the memory cells 71. In view of this, in this embodiment, each refresh counter 61 receives a refresh clock CLKref from the control circuit 13, updates the refresh address every time the refresh clock CLKref is received, and outputs the updated refresh address to the selector 31. The control circuit 13 generates the refresh clock CLKref in the following manner. The control circuit 13 has a frequency divider and a period change circuit (refresh period setting means; not shown) incorporated therein, and divides a clock CLK as shown in FIG. 7 (into four in the illustrated example), to generate the refresh clock CLKref. The dividing factor, by which the clock CLK is divided, depends on the period of the clock CLK. For example, when a refresh period of 50 MHz is determined from the signal holding property of the memory cells 71, the clock CLK is divided by four if it is 200 MHz as shown in FIG. 8A, and divided by two if it is 100 MHz as shown in FIG. 8B. The period change circuit calculates the period of the clock CLK and determines the factor by which the clock CLK should be divided.

Thus, in this embodiment, refresh operation is performed at a period determined by the refresh clock CLKref obtained by dividing the clock CLK. This eliminates the necessity of performing refresh operation at every cycle of the clock CLK. Thus, with reduced power consumption, an excellent semiconductor device is attained. Moreover, by changing the dividing factor according to the period of the clock CLK in the cycle change circuit, it is possible to provide a period for the refresh operation corresponding to a variety of clock cycles, and thus attain a semiconductor memory device with high general versatility.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A semiconductor memory device having a memory cell array in which a word line is selected according to an external access, the device comprising:
   a plurality of memory sub-arrays forming a memory cell array;
   a normal word line selection circuit for selecting a word line in the memory cell array according to an external address;
   a refresh word line selection circuit for selecting a word line in the memory cell array according to a refresh address;
   a control circuit responsive to a normal access command for controlling the normal word line selection circuit and the refresh word line selection circuit such that a selection of a word line by the refresh word line selection circuit is performed in synchronism with a selection of a word line by the normal word line selection circuit in a different memory sub-array; and
   sense amplifier sub-arrays provided for the respective memory sub-arrays for amplifying data corresponding to a word line selected by any of the normal and refresh word line selection circuits.

2. The semiconductor memory device of claim 1, wherein the refresh word line selection circuit is shared by the plurality of memory sub-arrays.

3. The semiconductor memory device of claim 1, wherein the selection of a word line by the refresh word line selection circuit is performed with the same timing as the selection of a word line by the normal word line selection circuit.

4. The semiconductor memory device of claim 1, wherein the refresh address is generated internally.

5. The semiconductor memory device of claim 1, wherein the memory cell array includes a plurality of memory cells,
   each of the memory cells includes one capacitor and two MOS transistors connected to the capacitor, and
   the two MOS transistors are connected to different bit lines, and data in the capacitor is read into the two bit lines alternately by operating the two MOS transistors alternately.

6. The semiconductor memory device of claim 1, wherein the refresh word line selection circuit is provided for each of the memory sub-arrays.

7. The semiconductor memory device of claim 3, wherein the refresh word line selection circuit is constructed of a shift register for selecting one word line sequentially.

8. The semiconductor memory device of claim 6, wherein the selection of a word line by the refresh word line selection circuit is performed at a predetermined refresh period for each memory sub-array.

9. The semiconductor memory device of claim 1, wherein the selection of a word line by the refresh word line selection circuit is performed at a predetermined refresh period for each memory sub-array.

10. The semiconductor memory device of claim 9, wherein the control circuit receives an external clock for synchronization of an external access and the control circuit generates a refresh clock for setting the predetermined refresh period by dividing the external clock.

11. The semiconductor memory device of claim 10, wherein the control circuit changes a dividing factor according to a period of the external clock.

12. A semiconductor memory device having a memory cell array in which a word line is selected according to an external access, the device comprising:
   a plurality of memory sub-arrays obtained by dividing the memory cell array;
   normal word line selection means for selecting a word line in the memory cell array according to an external access;
   refresh word line selection means for selecting a word line at the same timing as the selection of the word line by the normal word line selection means in a memory sub-array other than the memory sub-array to which the word line selected by the normal word line selection means belongs; and
   sense amplifier sub-arrays provided for the respective memory sub-arrays for amplifying data corresponding to a word line selected by any of the normal and refresh word line selection means,
   wherein the memory cell array includes a plurality of memory cells,
   each of the memory cells includes one capacitor and two MOS transistors connected to the capacitor, and
   the two MOS transistors are connected to different bit lines, and data in the capacitor is read into the two bit lines alternately by operating the two MOS transistors alternately.

* * * * *